US006861696B1

(12) United States Patent
Kim et al.

(10) Patent No.: US 6,861,696 B1
(45) Date of Patent: Mar. 1, 2005

(54) STRUCTURE AND METHOD FOR A TWO-BIT MEMORY CELL

(75) Inventors: Hyeon-Seag Kim, San Jose, CA (US); Nian Yang, Mountain View, CA (US); Munseork Choi, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/429,140

(22) Filed: May 3, 2003

(51) Int. Cl.[7] .............................................. H01L 29/76
(52) U.S. Cl. ...................................... 257/314; 257/401
(58) Field of Search ................................ 257/314, 315, 257/316, 317, 321, 390, 401

(56) References Cited

U.S. PATENT DOCUMENTS 5,108,939 A * 4/1992 Manley et al. ............... 438/594
6,153,904 A * 11/2000 Yang ............................ 257/316
6,329,687 B1 * 12/2001 Sobek et al. ................. 257/314

* cited by examiner

Primary Examiner—Phuc T. Dang
(74) Attorney, Agent, or Firm—Farjami & Farjami LLP

(57) ABSTRACT

According to one exemplary embodiment, a two-bit memory cell situated over a substrate comprises a tunnel oxide layer situated over the substrate. The two-bit memory cell further comprises a first spacer and a second spacer situated over the tunnel oxide layer, where the first spacer is a first data bit storage location in the two-bit memory cell and the second spacer is a second data bit storage location in the two-bit memory cell. The first spacer and the second spacer may be, for example, silicon nitride or polycrystalline silicon. According to this exemplary embodiment, the two-bit memory cell further comprises an oxide layer situated between the first spacer and the second spacer. The two-bit memory cell further comprises a control gate situated over the oxide layer.

15 Claims, 8 Drawing Sheets

STRUCTURE AND METHOD FOR A TWO-BIT MEMORY CELL

TECHNICAL FIELD

The present invention is generally in the field of fabrication of semiconductor devices. More specifically, the present invention is in the field of fabrication of memory cells in semiconductor devices.

BACKGROUND ART

Product development efforts in flash memory devices have focused on increasing the programming speed, lowering programming and reading voltages, increasing data retention time, reducing cell erasure times, reducing cell dimensions, and optimizing dielectric materials used in memory cells. One important dielectric material for fabrication of the flash memory device is an Oxide-Nitride-Oxide (ONO) stack. During programming, electrical charge is transferred from the substrate to the silicon nitride layer in the ONO stack. Voltages are applied to the gate and drain creating vertical and lateral electric fields, which accelerate the electrons along the length of the channel. As the electrons move along the channel, some of them gain sufficient energy to jump over the potential barrier of the bottom oxide layer and become trapped and stored in the nitride layer.

The ONO stack can be utilized in memory cells capable of storing two independent bits in separate locations within the memory cell, such as Advanced Micro Devices' (AMD) MirrorBit™ memory cells, to achieve high-density flash memory devices. In a conventional two-bit memory cell, a right and a left bit can be stored in respective storage locations situated on the right and left sides of the conventional two-bit memory cell. The right and left bits are stored as electrical charges, which, as discussed above, are stored in the charge storage layer, i.e. the nitride layer, of the ONO stack in the conventional two-bit memory cell. However, in the conventional two-bit memory cell, the nitride layer is a continuous layer. As a result, electrical charge can travel between the separate storage locations in the conventional two-bit memory cell, which can cause remnant charge to form in the middle of the charge storage layer of the ONO stack and undesirably decrease the performance of the conventional two-bit memory cell. Also, remnant charge can cause an undesirable increase in cell erasure time, since remnant charge represents additional charge that must be removed during a cell erase cycle.

Additionally, a conventional two-bit memory cell that is situated on an edge of a memory cell array ("edge memory cell") utilizes only one storage location and, consequently, does not suffer from the undesirable affects of remnant charge. However, in a conventional two-bit memory cell that is not situated on an edge of the memory cell array ("core memory cell"), electrical charge can travel between two storage locations within the cell, which can cause undesirable remnant charge to occur in the channel between the two storage locations. As a result, the threshold voltage of a conventional edge two-bit memory cell is different than the threshold voltage of a conventional core two-bit memory cell, which undesirably affects the overall performance of the conventional two-bit memory cell array.

Thus, there is a need in the art for a two-bit memory cell that achieves increased performance while preventing undesirable occurrence of remnant charge within the two-bit memory cell.

SUMMARY

The present invention is directed to structure and method for a two-bit memory cell. The present invention addresses and resolves the need in the art for a two-bit memory cell that achieves increased performance while preventing undesirable occurrence of remnant charge within the two-bit memory cell.

According to one exemplary embodiment, a two-bit memory cell situated over a substrate comprises a tunnel oxide layer situated over the substrate. The two-bit memory cell can be a two-bit flash memory cell, for example. The two-bit memory cell further comprises a first spacer and a second spacer situated over the tunnel oxide layer, where the first spacer is a first data bit storage location in the two-bit memory cell and the second spacer is a second data bit storage location in the two-bit memory cell. The first spacer may be separated from the second spacer by a distance of between approximately 5.0 Angstroms and approximately 1000.0 Angstroms, for example. The first spacer and the second spacer may be, for example, silicon nitride or polycrystalline silicon.

According to this exemplary embodiment, the two-bit memory cell further comprises an oxide layer situated between the first spacer and the second spacer. The two-bit memory cell further comprises a control gate situated over the oxide layer. The two-bit memory cell further comprises source and drain regions, where the tunnel oxide layer is situated between the source and drain regions. According to one embodiment, the invention is a method for achieving the above-described structure. Other features and advantages of the present invention will become more readily apparent to those of ordinary skill in the art after reviewing the following detailed description and accompanying drawings.

DETAILED DESCRIPTION OF THE INVENTION

The present invention is directed to structure and method for a two-bit memory cell. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
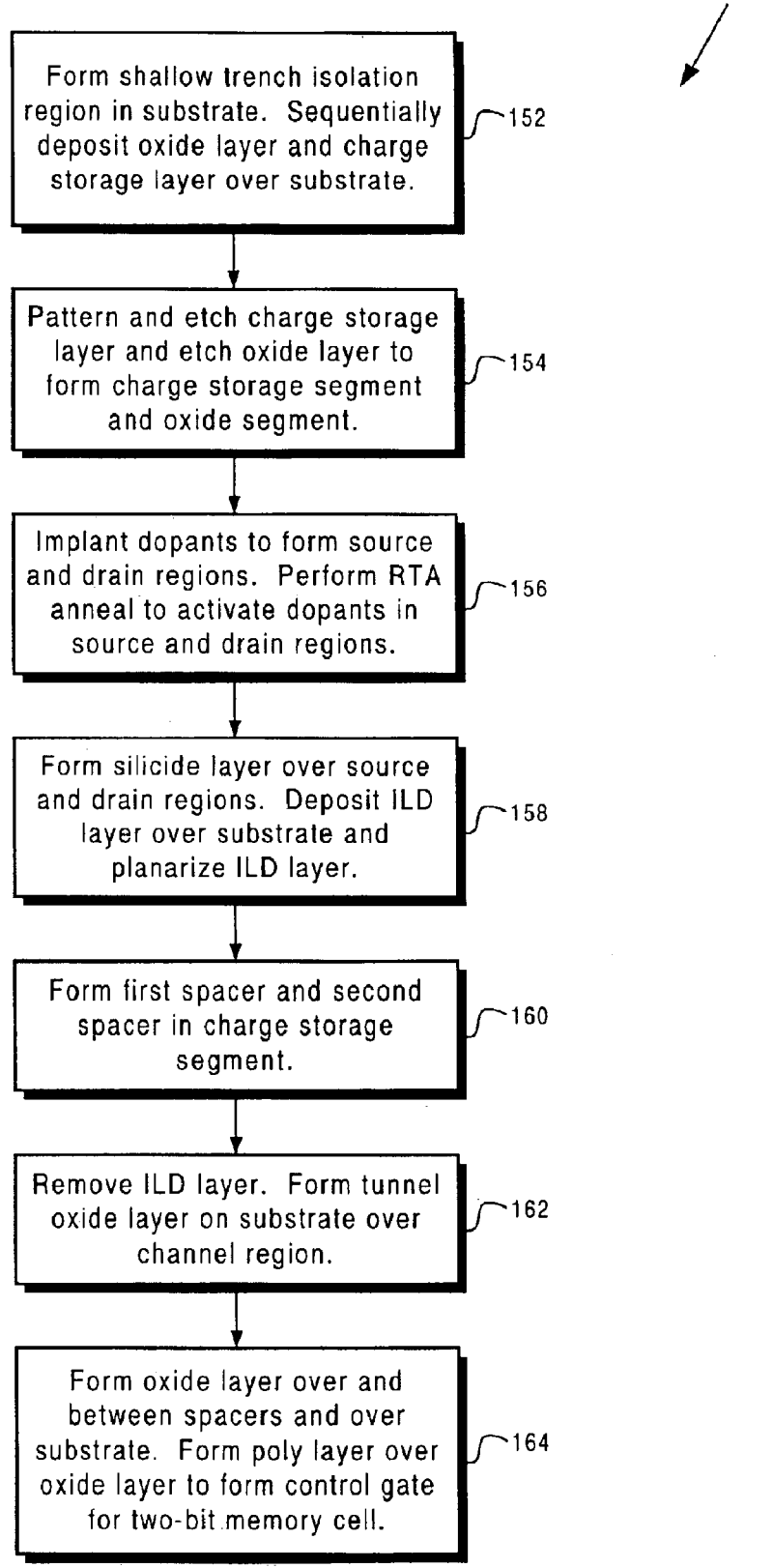
FIG. 1 is a flowchart corresponding to exemplary method steps according to ne embodiment of the present invention.

FIG. 1 shows a flowchart illustrating an exemplary method according to an embodiment of the present invention. Certain details and features have been left out of flowchart 100 that are apparent to a person of ordinary skill in the art. For example, a step may consist of one or more substeps or may involve specialized equipment or materials, as known in the art. While steps 152 through 164 indicated in flowchart 100 are sufficient to describe one embodiment of the present invention, other embodiments of the invention may utilize steps different from those shown in flowchart 100. It is noted that the processing steps shown in flowchart 100 are performed on a wafer, which, prior to step 152, includes a semiconductor structure. In particular, the wafer includes a silicon substrate on which two-bit memory cells, such as two-bit flash memory cells, will be formed.

Moreover, structures 252 through 264 in FIGS. 2A through 2G illustrate the result of performing, on the structure including a silicon substrate discussed above, steps 152 through 164 of flowchart 100, respectively. For example, structure 252 shows the structure discussed above after processing step 152, structure 254 shows structure 252 after the processing of step 154, structure 256 shows structure 254 after the processing of step 156, and so forth.

Figure 2A:
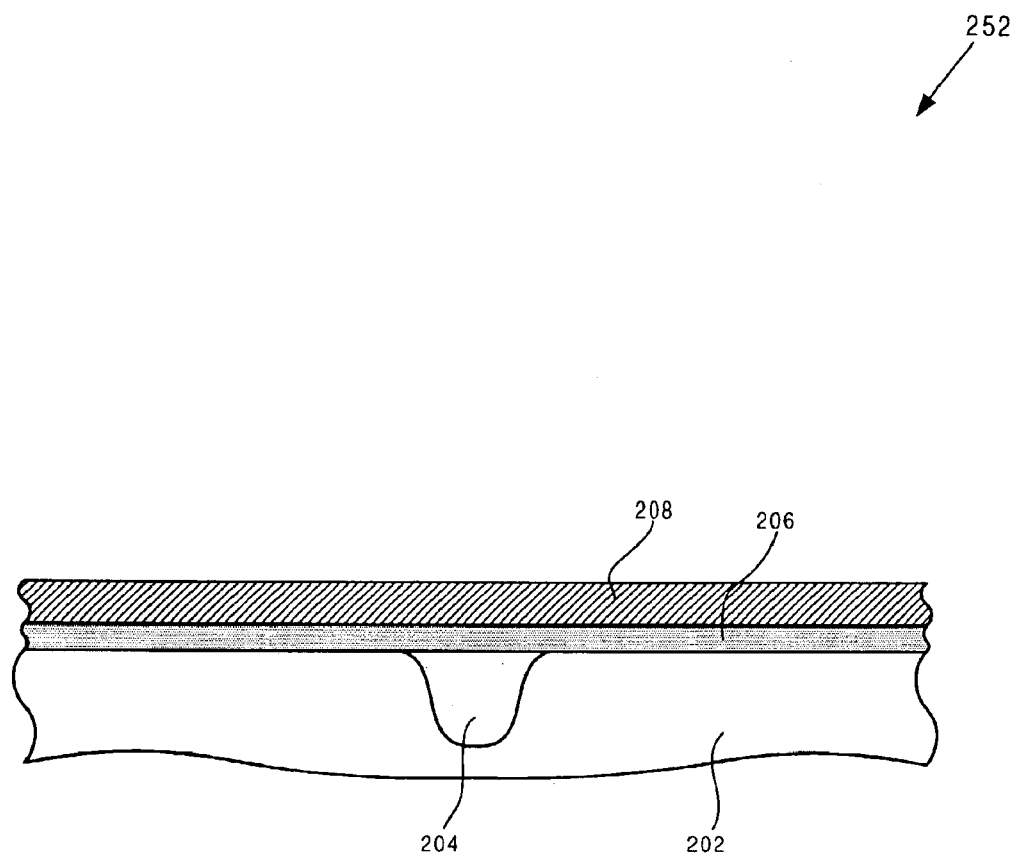
FIG. 2A illustrates a cross-sectional view of a portion of a wafer processed according to an embodiment of the invention, corresponding to certain steps of the flowchart in FIG. 1.

Referring now to FIG. 2A, structure 252 of FIG. 2A shows the structure discussed above after completion of step 152 of flowchart 100 in FIG. 1. At step 152, shallow trench isolation ("STI") region 204 is formed in substrate 202. STI region 204 can comprise tetraethylorthosilicate ("TEOS") silicon oxide or high-density plasma ("HDP") silicon oxide and can be formed in substrate 202 in a manner known in the art. In one embodiment, STI region 204 is not utilized. Also at step 152, oxide layer 206 and charge storage layer 208 are sequentially deposited over substrate 202. Oxide layer 206 can be deposited over substrate 202 by utilizing a chemical vapor deposition ("CVD") process or other suitable processes and can comprise silicon dioxide ("oxide"). Charge storage layer 208 can be deposited over oxide layer 206 utilizing a CVD process or other suitable processes and can comprise silicon nitride or polycrystalline silicon ("poly"). Thus, the result of step 152 of flowchart 100 is illustrated by structure 252 in FIG. 2A.

Figure 2B:
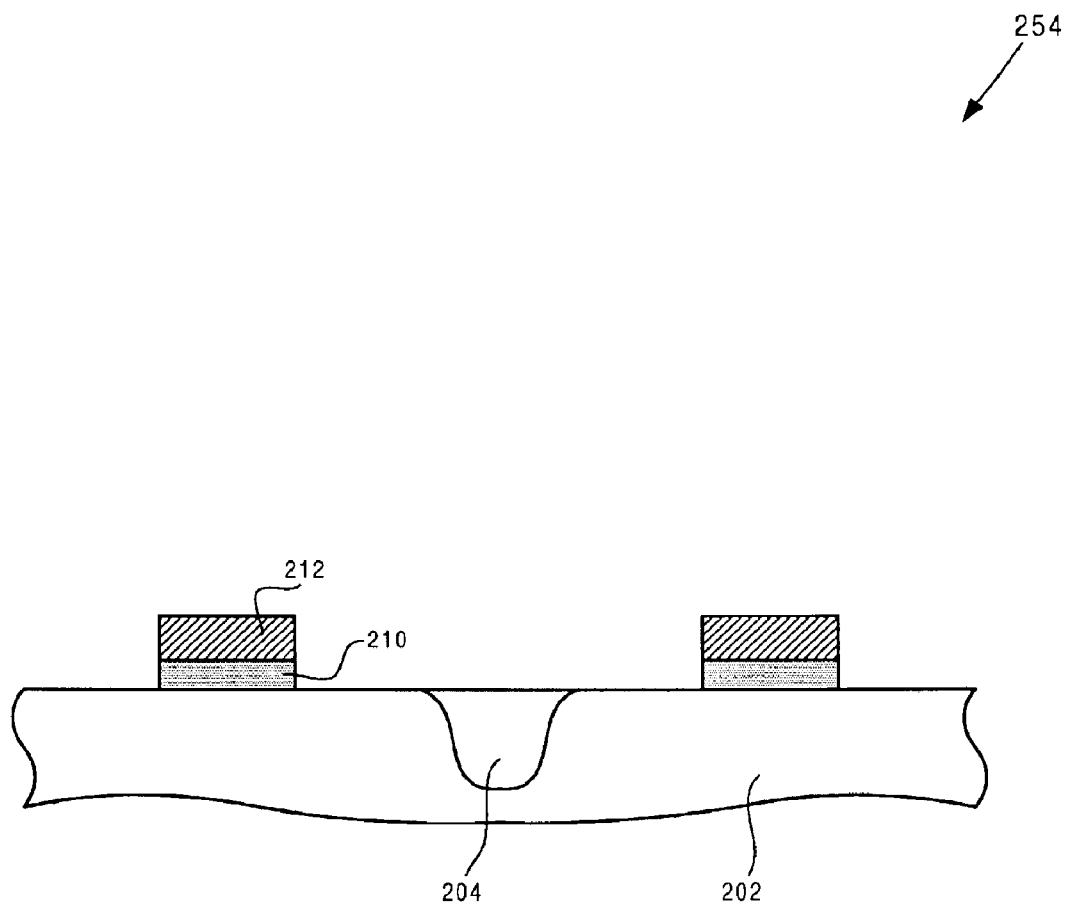
FIG. 2B illustrates a cross-sectional view of a portion of a wafer processed according to an embodiment of the invention, corresponding to certain steps of the flowchart in FIG. 1.

Continuing with step 154 in FIG. 1 and structure 254 in FIG. 2B, at step 154 of flowchart 100, charge storage layer 208 is patterned and etched to form charge storage segment 212 and oxide layer 206 is etched to form oxide segment 210. Charge storage layer 208 can be patterned and etched in a manner known in the art to form charge storage segment 212 and oxide layer 206 can be etched utilizing a suitable etchant to form oxide segment 210, which is situated between charge storage segment 212 and substrate 202. Referring to FIG. 2B, the result of step 154 of flowchart 100 is illustrated by structure 254.

Figure 2C:
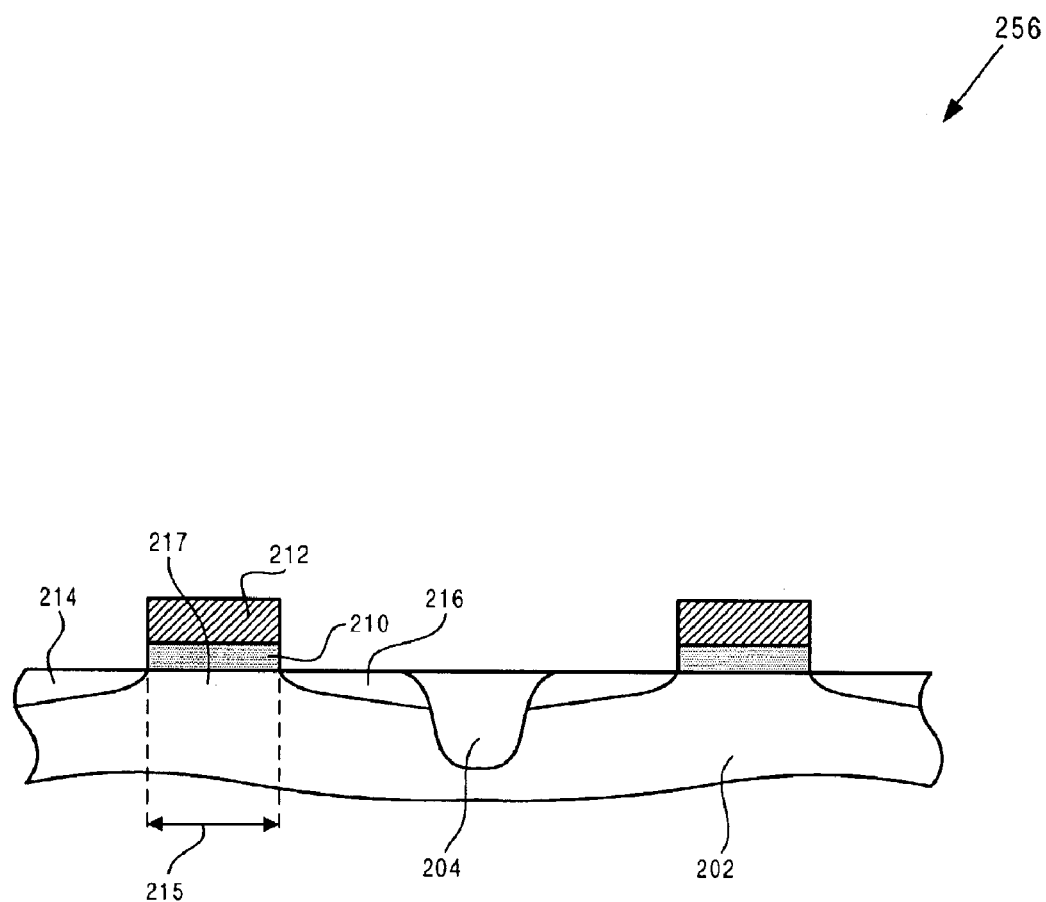
FIG. 2C illustrates a cross-sectional view of a portion of a wafer processed according to an embodiment of the invention, corresponding to certain steps of the flowchart in FIG. 1.

Continuing with step 156 in FIG. 1 and structure 256 in FIG. 2C, at step 156 of flowchart 100, dopants are implanted in substrate 202 to form source region 214 and drain region 216. Source region 214 and drain region 216 can be formed by utilizing a P+ implant comprising boron or other appropriate P type dopant. In one embodiment, source region 214 and drain region 216 can be formed by utilizing an N+ implant comprising arsenic or other appropriate N type dopant. Also at step 156, a rapid thermal activation ("RTA") anneal is performed to activate implanted dopants in source region 214 and drain region 216. Source region 214 and drain region 216 also define channel region 217, which is situated in substrate 202 between source region 214 and drain region 216. Length 215 of channel region 217 is technology dependent and can be between approximately 0.10 micron and approximately 0.35 micron. In one embodiment, length 215 can be less than 0.10 micron. It is noted that source region 214 and drain region 216 are also referred to as "bit lines" in the present application, since one or both of source region 214 and drain region 216 can be connected to a bit line in the memory array. Referring to FIG. 2C, the result of step 156 of flowchart 100 is illustrated by structure 256.

Figure 2D:
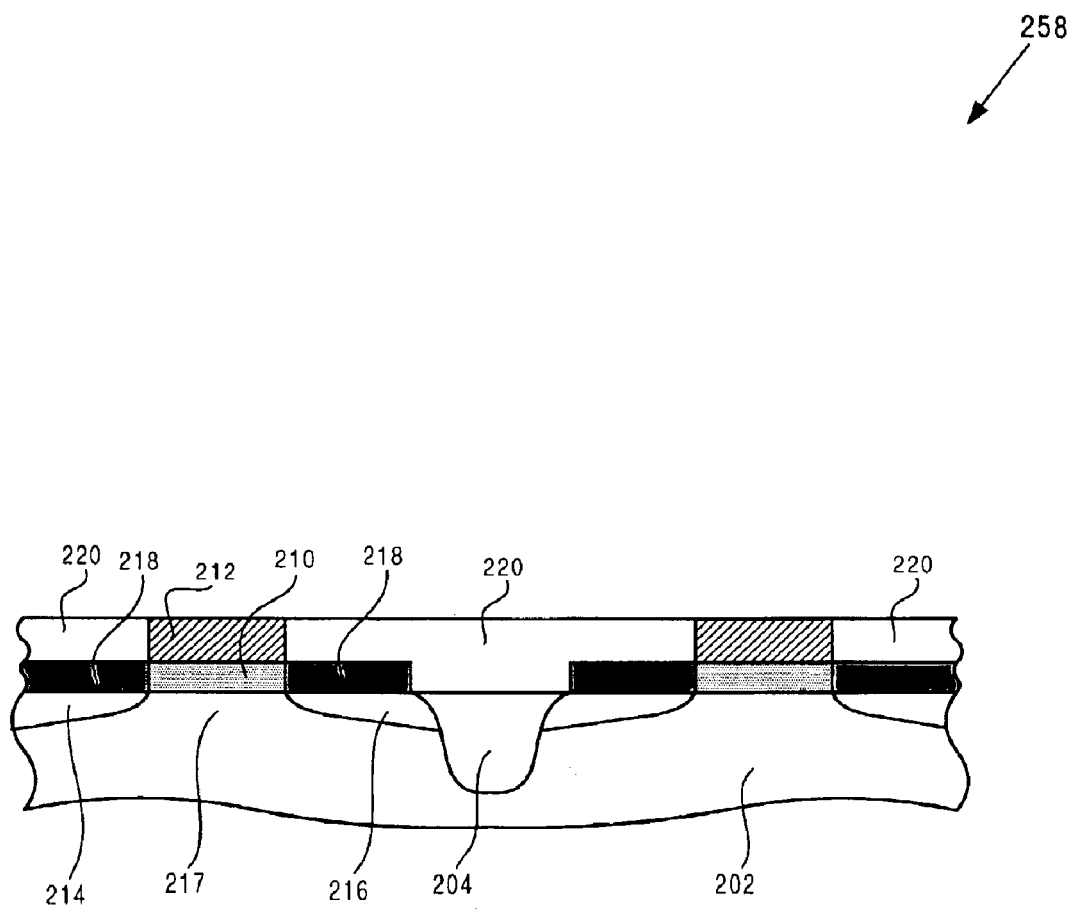
FIG. 2D illustrates a cross-sectional view of a portion of a wafer processed according to an embodiment of the invention, corresponding to certain steps of the flowchart in FIG. 1.

Continuing with step 158 in FIG. 1 and structure 258 in FIG. 2D, at step 158 of flowchart 100, silicide layer 218 is formed over source region 214 and drain region 216. Suicide layer 218 can be formed by depositing and patterning a layer of silicide over source region 214 and drain region 216 in a manner known in the art. Also at step 158, interlayer dielectric ("ILD") layer 220 is deposited over substrate 202 and planarized. ILD layer 220 can be deposited by CVD process or other suitable processes and can comprise TEOS silicon oxide or HDP silicon oxide. ILD layer 220 can be planarized by utilizing a chemical mechanical polishing ("CMP") process such that the top surfaces of charge storage segment 212 and ILD layer 220 are substantial planar. Referring to FIG. 2D, the result of step 158 of flowchart 100 is illustrated by structure 258.

Figure 2E:
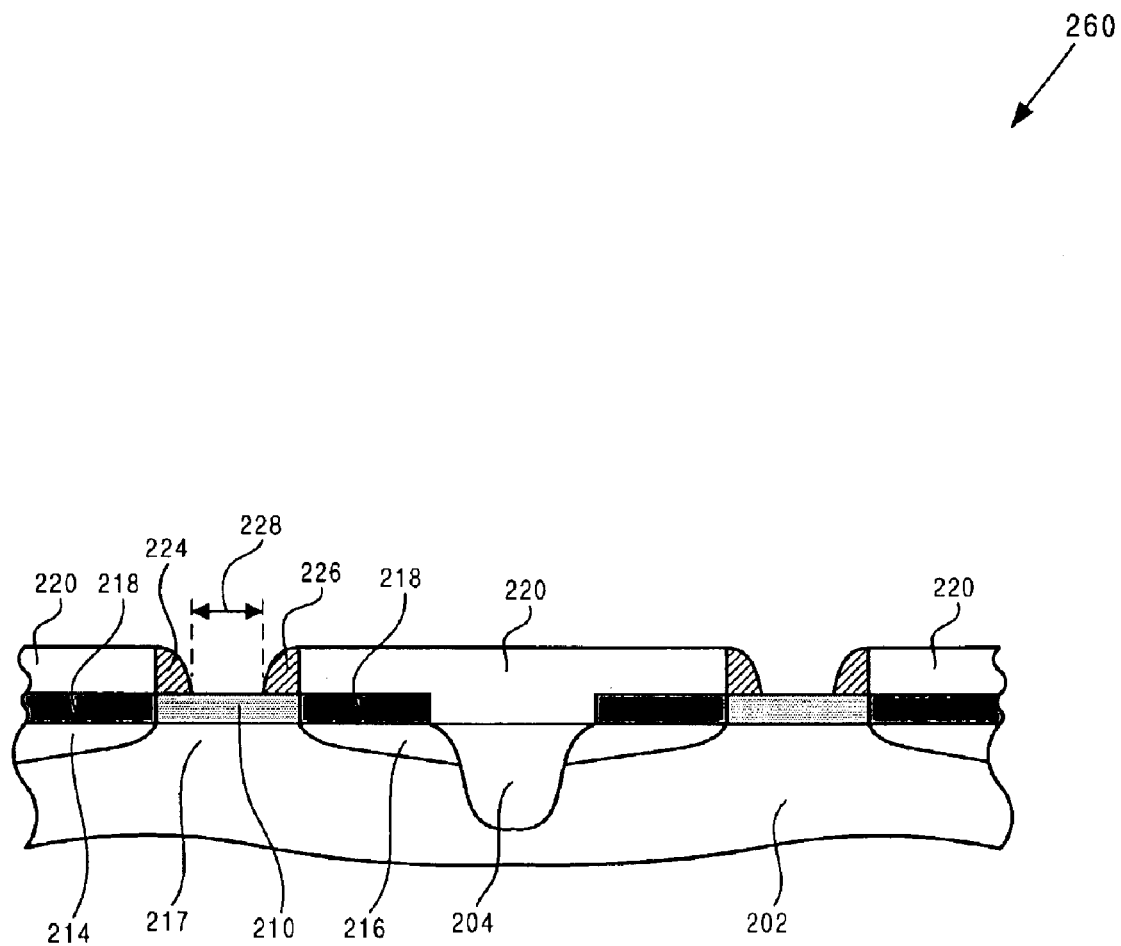
FIG. 2E illustrates a cross-sectional view of a portion of a wafer processed according to an embodiment of the invention, corresponding to certain steps of the flowchart in FIG. 1.

Continuing with step 160 in FIG. 1 and structure 260 in FIG. 2E, at step 160 of flowchart 100, spacers 224 and 226 are formed in charge storage segment 212. Spacers 224 and 226 can be formed by anisotropically etching charge storage segment 212 utilizing a reactive ion etch ("RIE") or an etchant such as phosphine ("PH$_3$") and can comprise silicon nitride or polycrystalline silicon. In the present invention, spacers 224 and 226 each provide a data bit storage location in a two-bit memory cell formed in a subsequent process step. As a result of the anisotropic etch process, a middle portion of charge storage segment 212 is removed, which prevents an electrical charge from travelling between spacer 224 and spacer 226. Spacer 224 is separated from spacer 226 by distance 228, which can be between approximately 5.0 Angstroms and approximately 1000.0 Angstroms. The width of spacers 224 and 226 can be determined by controlling the duration of the etch process discussed above. Thus, for example, by increasing the duration of the anisotropic etch process, the width of spacers 224 and 226 can be correspondingly decreased, which decreases the size of spacers 224 and 226. By decreasing the size of spacers 224 and 226, the present invention can advantageously achieve a smaller two-bit memory cell, which allows the density of the two-bit memory cell to be increased. Thus, by removing a middle portion of charge storage segment 212 to form spacers 224 and 226, the present invention prevents electrical charge from travelling between spacer 224 and spacer 226, which advantageously increases two-bit memory cell performance. Referring to FIG. 2E, the result of step 160 of flowchart 100 is illustrated by structure 260.

Figure 2F:
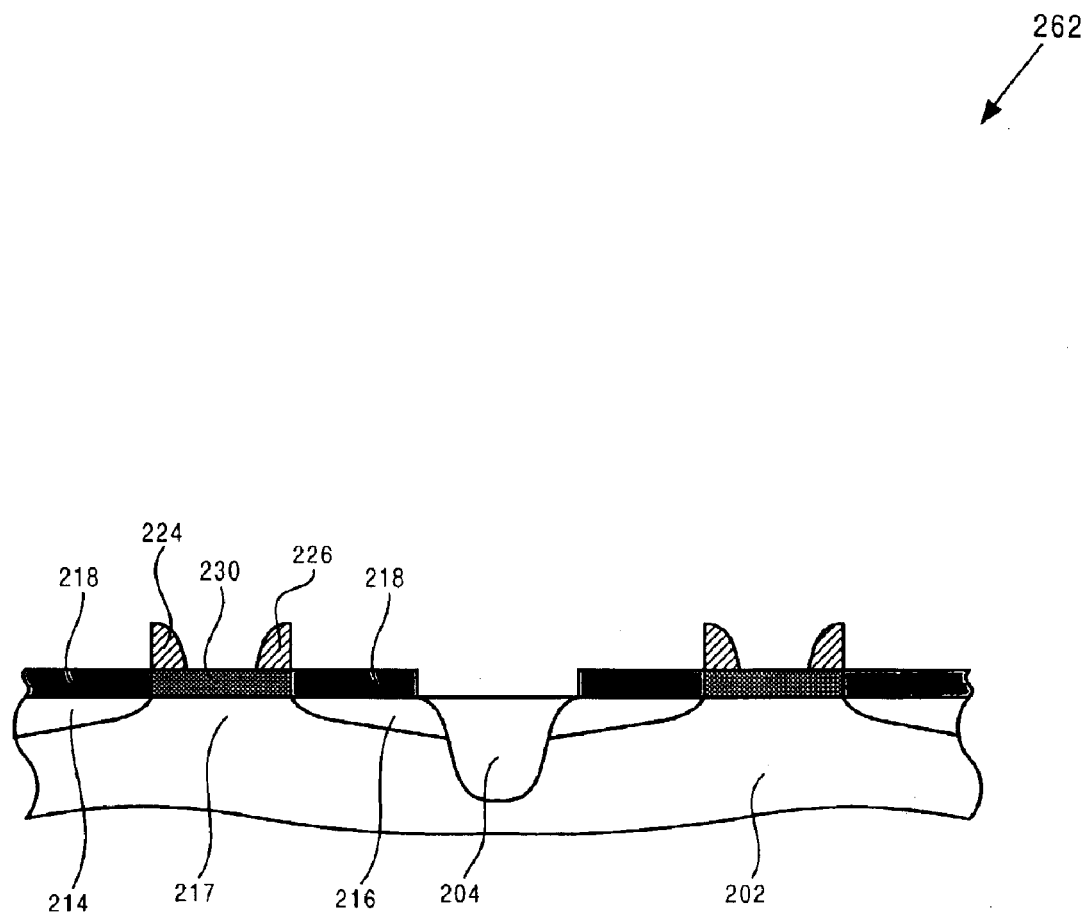
FIG. 2F illustrates a cross-sectional view of a portion of a wafer processed according to an embodiment of the invention, corresponding to certain steps of the flowchart in FIG. 1.

Continuing with step 162 in FIG. 1 and structure 262 in FIG. 2F, at step 162 of flowchart 100, ILD layer 220 and a portion of oxide segment 210 situated between spacers 224 and 226 are removed. ILD layer 220 and the portion of oxide segment 210 situated between spacers 224 and 226 can be removed by utilizing a suitable etchant known by a person having ordinary skill in the art. Also at step 162, tunnel oxide layer 230 is formed on substrate 202 over channel region 217. Tunnel oxide layer 230 can be thermally grown on substrate 202 and can comprise silicon dioxide, for example. In one embodiment, tunnel oxide layer 230 can be deposited over channel region 217 utilizing a CVD process or other suitable processes. Referring to FIG. 2F, the result of step 162 of flowchart 100 is illustrated by structure 262.

Figure 2G:
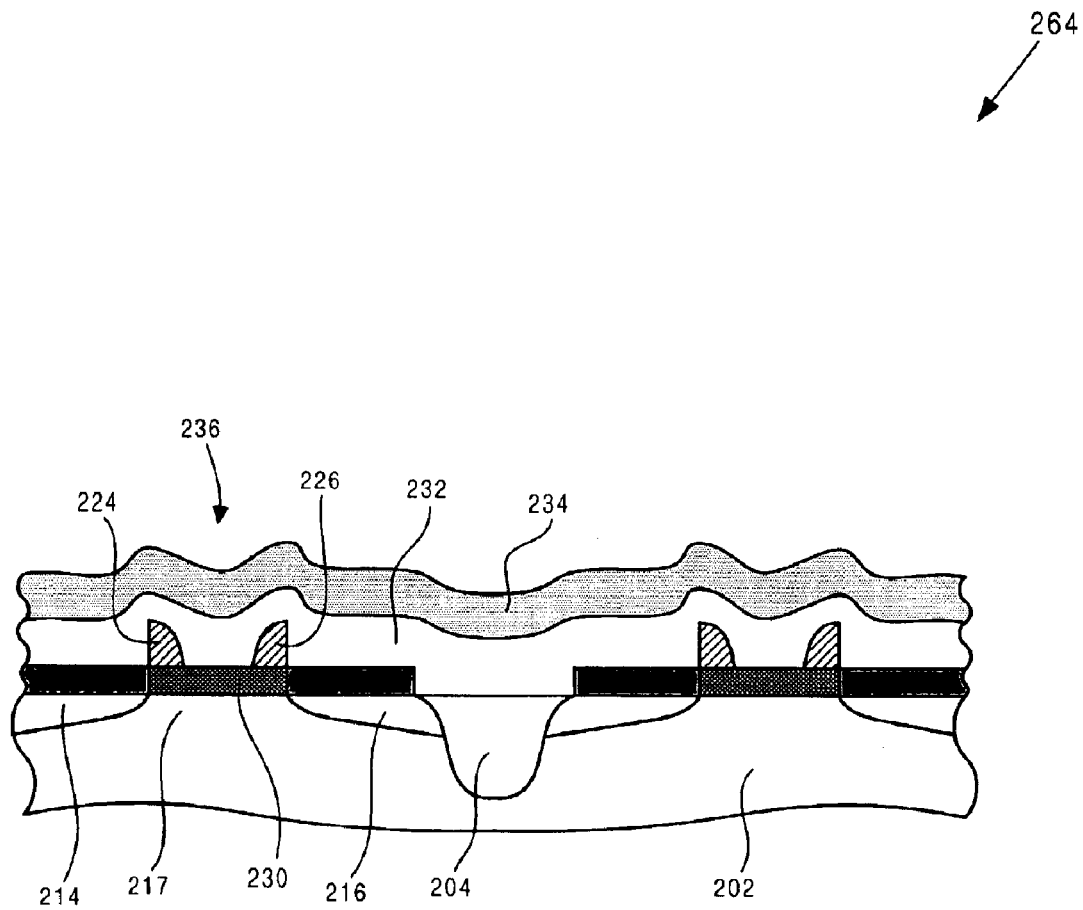
FIG. 2G illustrates a cross-sectional view of a portion of a wafer processed according to an embodiment of the invention, corresponding to certain steps of the flowchart in FIG. 1.

Continuing with step 164 in FIG. 1 and structure 264 in FIG. 2G, at step 164 of flowchart 100, oxide layer 232 is formed over and between spacers 224 and 226 and over substrate 202. Oxide layer 232 can be formed by depositing a layer of silicon dioxide by a CVD process or other suitable processes or by growing a layer of silicon dioxide over spacers 224 and 226 and substrate 202. Poly layer 234 can be grown over oxide layer 232 and can comprise polycrystalline silicon. Poly layer 234 forms a control gate for two-bit memory cell 236, which also includes tunnel oxide layer 230, spacers 234 and 236, and oxide layer 232. In two-bit memory cell 236, spacers 234 and 236 are utilized to store respective data bits. Referring to FIG. 2G, the result of step 164 of flowchart 100 is illustrated by structure 264.

As discussed above, by creating a discontinuity in a charge storage segment by removing a portion of the charge storage segment to form spacers, the present invention advantageously prevents electrical charge from traveling between independent charge storage locations, e.g., spacers 234 and 236, in a two-bit memory cell. As a result, the present invention eliminates undesirable remnant charge from being stored between charge storage locations in the two-bit memory cell, which reduces erase time and increases two-bit memory cell performance. Additionally, by eliminating undesirable remnant charge, the present invention advantageously achieves a two-bit memory cell that has a threshold voltage that is not dependent on the location of the two-bit memory cell in a memory array. In contrast, in a conventional two-bit memory cell, a two-bit memory cell situated on an edge of a memory array has a different threshold voltage compared to a two-bit memory cell that is not situated on the edge of the memory array. Furthermore, by controlling the size of spacers utilized to store electrical charge, the present invention advantageously achieves a two-bit memory cell that can be reduced in size. As a result, the present invention advantageously achieves a two-bit memory cell having higher density and higher performance.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, structure and method for a two-bit memory cell have been described.

What is claimed is:

1. A two-bit memory cell situated over a substrate, said two bit memory cell comprising:

a tunnel oxide layer situated over said substrate;

a first spacer and a second spacer situated over said tunnel oxide layer, said tunnel oxide layer being situated between said first spacer and said second spacer, said first spacer being a first data bit storage location in said two-bit memory cell and said second spacer being a second data bit storage location in said two-bit memory cell.

2. The two-bit memory cell of claim 1, further comprising an oxide layer situated between said first spacer and said second spacer.

3. The two-bit memory cell of claim 2 further comprising a control gate situated over said oxide layer.

4. The two-bit memory cell of claim 1 further comprising a source region and a drain region situated in said substrate, said tunnel oxide layer being situated between said source region and said drain region.

5. The two-bit memory cell of claim 1 wherein said first spacer and said second spacer are separated by a distance, said distance being between approximately 5.0 Angstroms and approximately 1000.0 Angstroms.

6. The two-bit memory cell of claim 1 wherein said first spacer and said second spacer comprise silicon nitride.

7. The two-bit memory cell of claim 1 wherein said first spacer and said second spacer comprise polycrystalline silicon.

8. The two-bit memory cell of claim 1 wherein said two-bit memory cell is a two-bit flash memory cell.

9. A two-bit memory cell situated over a substrate, said two-bit memory cell comprising a tunnel oxide layer situated over said substrate, said two-bit memory cell being characterized in that:

a first spacer and a second spacer are situated over said tunnel oxide layer, said tunnel oxide layer being situated between said first spacer and said second spacer, said first spacer being a first data bit storage location in said two-bit memory cell and said second spacer being a second data bit storage location in said two-bit memory cell.

10. The two-bit memory cell of claim 9 further comprising an oxide layer situated between said first spacer and said second spacer.

11. The two-bit memory cell of claim 10 further comprising a control gate situated over said oxide layer.

12. The two-bit memory cell of claim 9 wherein said first spacer and said second spacer are separated by a distance, said distance being between approximately 5.0 Angstroms and approximately 1000.0 Angstroms.

13. The two-bit memory cell of claim 9 wherein said first spacer and said second spacer comprise silicon nitride.

14. The two-bit memory cell of claim 9 wherein said first spacer and said second spacer comprise polycrystalline silicon.

15. The two-bit memory cell of claim 9 wherein said two-bit memory cell is a two-bit flash memory cell.

* * * * *